United States Patent
Smith et al.

(10) Patent No.: US 10,396,438 B1
(45) Date of Patent: Aug. 27, 2019

(54) ANTENNA SYSTEM AND ELECTRONIC DEVICE INCLUDING ONE OR MORE CONDUCTIVE ELEMENTS FOR USE WITH A DIFFERENTIAL AND AN ALTERNATIVE SIGNAL SOURCE

(71) Applicant: Motorola Mobility LLC, Chicago, IL (US)

(72) Inventors: Hugh Smith, Palatine, IL (US); Mohammed Abdul-Gaffoor, Palatine, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 15/994,970

(22) Filed: May 31, 2018

(51) Int. Cl.
*H01Q 7/00* (2006.01)
*H01Q 1/24* (2006.01)
*H03H 7/40* (2006.01)
*H01Q 1/22* (2006.01)

(52) U.S. Cl.
CPC .......... *H01Q 1/243* (2013.01); *H01Q 1/2283* (2013.01); *H01Q 7/00* (2013.01); *H03H 7/40* (2013.01)

(58) Field of Classification Search
CPC .......... H01Q 1/24; H01Q 1/241; H01Q 1/242; H01Q 1/243; H01Q 7/00
See application file for complete search history.

(56) References Cited

U.S. PATENT DOCUMENTS

| | | | |
|---|---|---|---|
| 9,801,006 B2 | 10/2017 | Olgun et al. | |
| 2007/0024514 A1* | 2/2007 | Phillips | H01Q 7/00 343/744 |
| 2017/0098951 A1* | 4/2017 | Olgun | H02J 7/025 |
| 2017/0279199 A1* | 9/2017 | An | H01Q 5/335 |
| 2018/0048050 A1* | 2/2018 | Sayem | H01Q 1/243 |
| 2018/0069295 A1* | 3/2018 | Han | H01Q 1/243 |

OTHER PUBLICATIONS

Junsheng Zhao, et al., "Antenna System with Feedline Conductors at Least Partially Traversing a Gap Between Open Ends of Arms", U.S. Appl. No. 15/839,775, filed Dec. 12, 2017.
Yuji Tanabe et al., "A Small Dual-Band Asymmetric Dipole Antenna for 13.56 MHz Power and 2.45 GHz Data Transmission", IEEE Antennas and Wireless Propagation Letters, vol. 13, 2014, pp. 1120-1123.

* cited by examiner

*Primary Examiner* — Hoang V Nguyen
(74) *Attorney, Agent, or Firm* — Loppnow & Chapa

(57) ABSTRACT

The present application provides an antenna system for use in an electronic device. The antenna system includes a conductive substrate. The antenna system further includes a conductive element, which extends along a length between two ends a distance away from the conductive substrate. An area between the conductive substrate and the conductive element form at least part of a loop which is internal to the antenna system. The antenna system still further includes a differential signal source coupled between two points along the length of the conductive element. Each of the two points are proximate a respective one of the two ends of the conductive element. The differential signal source is coupled to each of the two points via a high frequency blocking circuit. Further yet, the antenna system includes an alternative signal source coupled to the conductive element between the two ends of the conductive element toward a center of the conductive element via a low frequency blocking circuit.

20 Claims, 6 Drawing Sheets

ANTENNA SYSTEM AND ELECTRONIC DEVICE INCLUDING ONE OR MORE CONDUCTIVE ELEMENTS FOR USE WITH A DIFFERENTIAL AND AN ALTERNATIVE SIGNAL SOURCE

FIELD OF THE APPLICATION

The present disclosure relates generally to electronic devices with an antenna, and more particularly, electronic devices pairing multiple signal sources and conductive elements as part of an antenna system.

BACKGROUND

Electronic devices, such as smartphones, are increasingly supporting use cases, where for certain functionality, it is desirable for the device to be able to support a larger display size. For example, larger display sizes can be desirable for viewing visual content as part of a media player or a browser, as well as for supporting the visual presentation of information as part of an application or program that is being executed by the device. However, such a trend needs to be balanced with a general desire for the overall size of the device to stay the same and even decrease in one or both of dimension and weight.

In an attempt to support larger display sizes without increasing the overall size of the device, device manufacturers have increasingly dedicated a larger percentage of the exterior surface to a display, where the display in many instances has grown in one or more dimensions to a size that dominates a particular surface, such as the front surface of the device. In at least some of these instances, the display has been allowed to extend into areas that had previously been used to support user inputs, such as areas of the surface that have previously supported a keypad, such as a numeric keypad.

Larger displays often mean larger openings in the housing, which can reduce the amount of material that is available to support the structural integrity of the housing, and correspondingly the device. As such, manufacturers are increasingly relying upon materials in the formation of the device housings, such as metals, that have historically better maintained structural integrity with less overall material. This is true for devices having a full metal rear housing, as well as devices that incorporate perimeter metal housings. However, housings made from conductive materials, such as metal, can interfere with the transmission and reception of wireless signals into and out of the device. In some cases the radiating elements associated with the transmission and reception of wireless signals can be integrated into the conductive structure, such as a housing incorporating increasing use of metals and/or alloys. Openings and/or cuts can be made in the housing to form conductive portions of the housing which can serve as the radiating portion of an antenna system. It then can become a challenge to be able to incorporate all of the conductive portions into the housing relative to the available surface space for use in supporting all of the desired types of transmission and/or receipt of wireless propagation of electromagnetic energy, and still meet overall size goals for the device.

The present innovators have recognized that by controlling the geometry of the antenna elements formed in a housing, as well as the manner in which the circuitry interacts with radiating and/or receiving elements of the antenna systems, it may be possible for some of the antenna elements to be used in support of the transmission and/or receipt of multiple types of electromagnetic energy. To the extent that components can be shared in support of multiple types of communication, the need for separate dedicated space to support separate elements can be avoided.

SUMMARY

The present application provides an antenna system for use in an electronic device. The antenna system includes a conductive substrate. The antenna system further includes a conductive element, which extends along a length between two ends a distance away from the conductive substrate. An area between the conductive substrate and the conductive element form at least part of a loop which is internal to the antenna system. The antenna system still further includes a differential signal source coupled between two points along the length of the conductive element. Each of the two points are proximate a respective one of the two ends of the conductive element. The differential signal source is coupled to each of the two points via a high frequency blocking circuit. Further yet, the antenna system includes an alternative signal source coupled to the conductive element between the two ends of the conductive element toward a center of the conductive element via a low frequency blocking circuit.

In at least one embodiment, the conductive substrate has a width, which corresponds to the distance between two opposite side edges of the conductive substrate proximate one end of the electronic device. In at least some of these instances, the antenna system can further include a pair of conductive arms, where each conductive arm in the pair of conductive arms has a connected end, which couples to the conductive substrate at alternative ones of the opposite side edges of the conductive substrate proximate the one end of the device, and an open end which extends away from the respective coupled side edge toward the other one of the opposite side edges in a direction of extension. The open ends of the conductive arms in the pair extend toward one another, stopping short of touching or overlapping the other conductive arm in the pair in the direction of extension away from the respective coupled side edge. A gap is thereby formed between the respective open ends of the pair of conductive arms. In some instances, the conductive element can extend between the respective open ends of the pair of conductive arms in the gap formed there between.

The present application further provides an antenna system for use in an electronic device. The antenna system includes a conductive substrate. The antenna system further includes a pair of separate conductive elements. Each conductive element extends along a length between two ends including a right side end and a left side end, a distance away from the conductive substrate. An area between the conductive substrate and each of the separate conductive elements form at least part of a loop which is internal to the antenna system. Along the respective lengths between the two ends, the separate conductive elements substantially overlap. The antenna system still further includes a differential signal source coupled between the pair of separate conductive elements at respective points along the length of the corresponding conductive element, each of the respective points being proximate a different one of the two ends of the separate conductive elements. A first terminal of the differential signal source is coupled proximate the right side end of a first one of the pair of separate conductive elements, and a second terminal of the differential signal source is coupled proximate the left side end of a second one of the pair of separate conductive elements. The conductive substrate is coupled proximate to the one of the two ends of each of the pair of separate conductive elements that is not coupled to the differential signal source.

The present application still further provides an electronic device. The electronic device includes a controller, a plurality of transceivers coupled to the controller, and an antenna system. The antenna system includes a conductive substrate. The antenna system further includes a conductive element, which extends along a length between two ends a distance away from the conductive substrate. An area between the conductive substrate and the conductive element form at least part of a loop which is internal to the antenna system. The antenna system still further includes a differential signal source of a first one of the plurality of transceivers, which is coupled between two points along the length of the conductive element. Each of the two points are proximate a respective one of the two ends of the conductive element. The differential signal source is coupled to each of the two points via a high frequency blocking circuit. Further yet, the antenna system includes an alternative signal source associated with a second one of the plurality of transceivers, which is coupled to the conductive element between the two ends of the conductive element toward a center of the conductive element via a low frequency blocking circuit.

These and other features, and advantages of the present disclosure are evident from the following description of one or more preferred embodiments, with reference to the accompanying drawings.

DETAILED DESCRIPTION OF THE PREFERRED EMBODIMENT(S)

Figure 1:
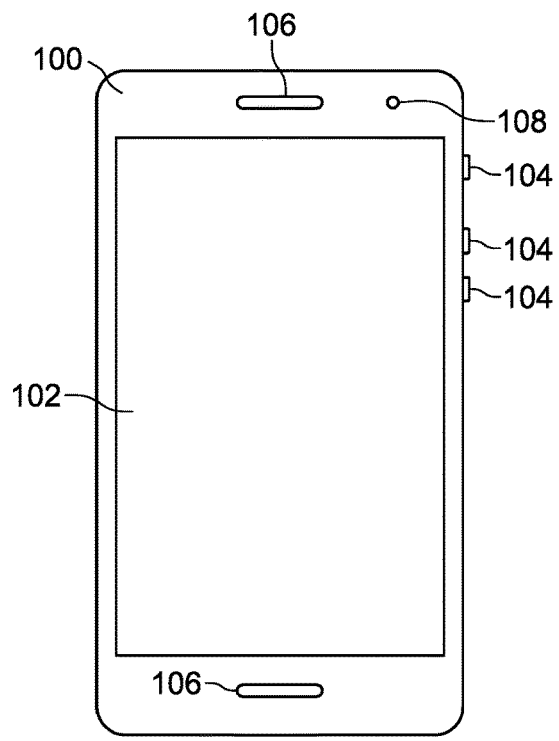
FIG. 1 is a front view of an exemplary electronic device.

While the present invention is susceptible of embodiment in various forms, there is shown in the drawings and will hereinafter be described presently preferred embodiments with the understanding that the present disclosure is to be considered an exemplification and is not intended to limit the invention to the specific embodiments illustrated. One skilled in the art will hopefully appreciate that the elements in the drawings are illustrated for simplicity and clarity and have not necessarily been drawn to scale. For example, the dimensions of some of the elements in the drawings may be exaggerated relative to other elements with the intent to help improve understanding of the aspects of the embodiments being illustrated and described.

FIG. 1 illustrates a front view of an exemplary electronic device 100, such as a wireless communication device. While in the illustrated embodiment, the type of wireless communication device shown is a radio frequency cellular telephone, other types of devices that include wireless radio frequency communication capabilities are also relevant to the present application. In other words, the present application is generally applicable to wireless communication devices beyond the type being specifically shown. A couple of additional examples of suitable wireless communication devices that may additionally be relevant to the present application in the incorporation and management of an antenna as part of the housing can include a tablet, a laptop computer, a desktop computer, a netbook, a cordless telephone, a selective call receiver, a gaming device, a personal digital assistant, as well as any other form of wireless communication device that might be used to manage wireless communications including wireless communications involving one or more different communication standards. A few examples of different communication standards include Global System for Mobile Communications (GSM) Code Division Multiple Access (CDMA), Orthogonal Frequency Division Multiple Access (OFDMA), Long Term Evolution (LTE), Global Positioning System (GPS), Bluetooth®, Wi-Fi (IEEE 802.11), Near Field Communication (NFC) as well as various other communication standards. In addition, the wireless communication device 100 may utilize a number of additional various forms of communication including systems and protocols that support a communication diversity scheme, as well as carrier aggregation and simultaneous voice and data that concurrently enables the use of simultaneous signal propagation.

In the illustrated embodiment, the radio frequency cellular telephone includes a display 102 which covers a large portion of the front facing. In at least some instances, the display can incorporate a touch sensitive matrix, that can help facilitate the detection of one or more user inputs relative to at least some portions of the display, including an interaction with visual elements being presented to the user via the display 102. In some instances, the visual element could be an object with which the user can interact. In other instances, the visual element can form part of a visual representation of a keyboard including one or more virtual keys and/or one or more buttons with which the user can interact and/or select for a simulated actuation. In addition to one or more virtual user actuatable buttons or keys, the device 100 can include one or more physical user actuatable buttons 104. In the particular embodiment illustrated, the device has three such buttons located along the right side of the device 100.

The exemplary electronic device 100, illustrated in FIG. 1, additionally includes a pair of speakers 106. The speakers 106 may support the reproduction of an audio signal, which could be associated with an ongoing voice communication or the playback of a streaming or stored media file, which can include a stand-alone signal, such as for use in the playing of music, or can be part of a multimedia presentation, such as for use in the playing of a movie, which might have at least an audio as well as a visual component. One or more of the speakers may also include the capability to also produce a vibratory effect. However, in some instances, the purposeful production of vibrational effects may be associated with a separate element, not shown, which is internal to the device.

In the present instance a pair of speakers can support the reproduction of stereophonic sound including both a left and a right channel associated with when the device is oriented in landscape mode, such as for viewing the playback of a movie. Otherwise, at least one of the speakers is located toward the top of the device, which corresponds to an orientation consistent with the respective portion of the device facing in an upward direction during usage in support of a voice communication. In such an instance, at least a corresponding one of the speakers 106 might be intended to align with the ear of the user, and at least one of one or more microphones (not shown) might be intended to align with the mouth of the user, which is often generally opposite the corresponding speaker 106 at a location at or proximate to the bottom of the device. Also located near the top of the device, in the illustrated embodiment, is a front facing camera 108. The wireless communication device will also generally include one or more radio frequency transceivers, as well as associated transmit and receive circuitry, including one or more antennas that may be incorporated as part of the housing of the device 100.

Figure 2:
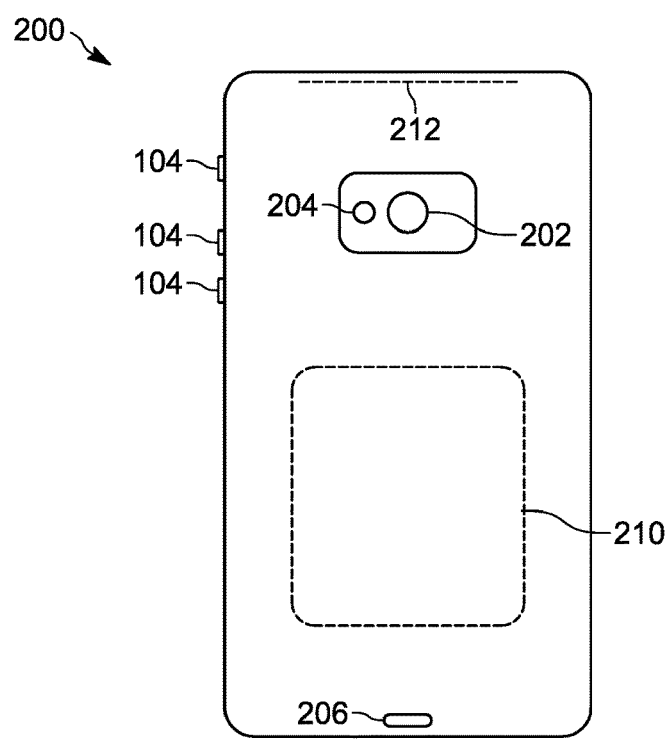
FIG. 2 is a back view of an exemplary electronic device.

FIG. 2 illustrates a back view 200 of the exemplary electronic device 100, illustrated in FIG. 1. In the back view of the exemplary portable electronic device, the three physical user actuatable buttons 104, which are visible in the front view, can similarly be seen. The exemplary hand held electronic device 100 additionally includes a back side facing camera 202 with a flash 204, as well as a serial bus port 206, which is generally adapted for receiving a cable connection, and which can be used to receive data and/or power signals. Still further, the illustrated embodiment includes an area 210 proximate the back side surface within which one or more coils, such as one or more loop antennas, can be located. The one or more coils could be adapted for supporting such functions as wireless charging and/or near field communications. Additionally, the one or more coils can be located internal to the device, often just below the back side surface of the device 100.

In addition and/or alternative to the one or more coils proximate the back side surface of the device 100 within the identified area 210, the device can include a conductor segment 212 proximate the top of the device, which can be arranged for supporting wireless charging and/or near field communications, and/or could simultaneously or alternatively be used in support of other forms of wireless communications. In each instance, the one or more coils proximate the back side surface and/or the top side conductor segment 212 can be used to transfer energy via an electromagnetic/inductive coupling with one or more sets of conductors associated with another device.

Figure 3:
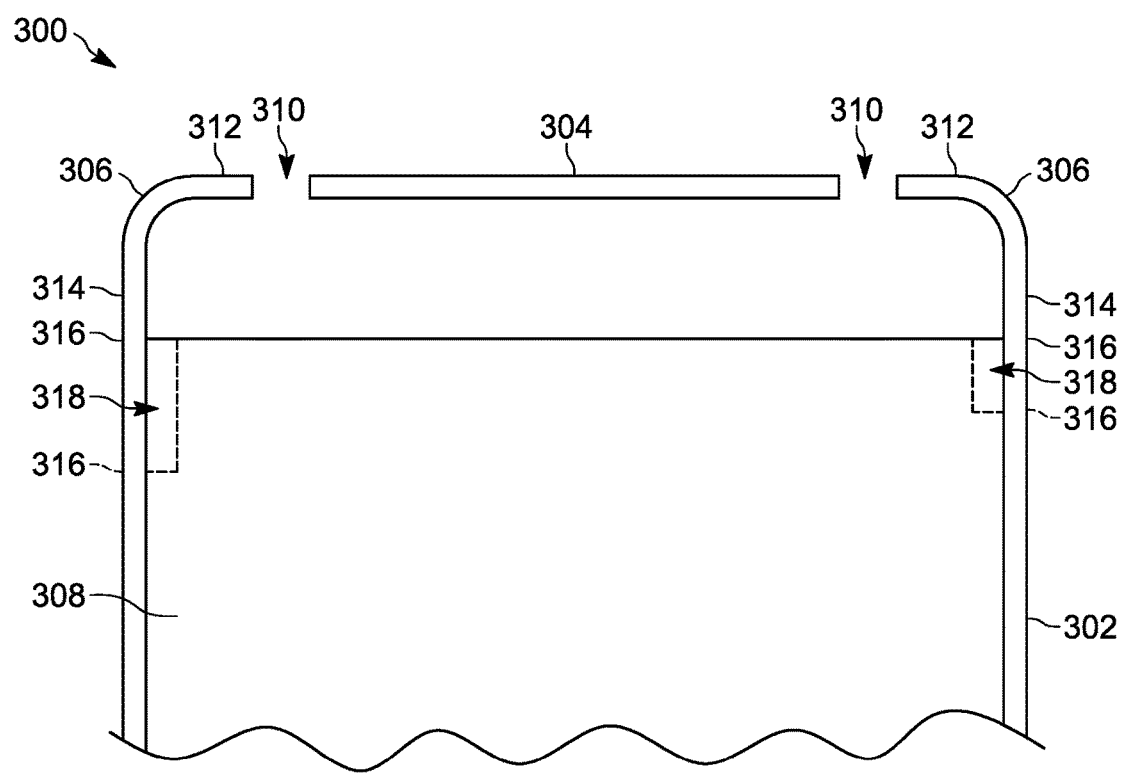
FIG. 3 is a partial front view of a perimeter conductive housing with a conductive element, a plurality of arms, and a conductive substrate, formed as part of an electronic device.

FIG. 3 illustrates a partial front view 300 of the top of a conductive housing 302 with a conductive element 304, a plurality of arms 306, and a conductive substrate 308, formed as part of an electronic device 100. Discontinuities 310 and/or gaps in the conductive housing 302 can serve to define the size and shape of the conductive element 304 and the plurality of arms 306, which in the illustrated embodiment are formed as part of the conductive housing 302. More specifically, each discontinuity 310 results in an end of a respective arm 306 being defined, as well as defines alternative ends of the conductive element 304.

In the illustrated embodiment, the conductive housing 302 has a perimeter that extends around the device 100, where in at least some instance the perimeter forms at least part of a sidewall of the device. The conductive substrate 308 is coupled to the conductive housing 302. The conductive element 304 and plurality of arms 306 are formed as part of portions of the perimeter of the conductive housing 302 that extends beyond the conductive substrate 308. The conductive element 304, as noted above, has two ends, each of which is defined by a respective one of the discontinuities 310. Each arm 306 also generally has two ends, one end 312 that coincides with a corresponding discontinuity 310 in the perimeter and an end 314 which is proximate the point that the uncoupled portion of the perimeter meets the conductive substrate 308. The overall length, and correspondingly the electrical length, of the conductive element 304 can be managed through the selection of the location of each of the discontinuities 310. The particular point 316 that the end 314 of a particular arm meets the conductive substrate 308 can be influenced by a corresponding notch 318 formed in the conductive substrate, which can extend along the length of the perimeter of the conductive housing. In other words, a notch 318 in the conductive substrate 308 proximate the point of coupling of the arm 306 to the conductive substrate 308 can serve to delay the position and/or the location relative to the conductive substrate 308 of the actual coupling. By delaying the point that a particular arm meets the conductive substrate 308, the electrical length of the arm 306 can be affected, which in turn will alter the ability of the arm 306 to transmit and receive electromagnetic energy of a particular frequency. The length of a notch 318, when present, can be selected to better tune the arm 306 for operation with a desired set of frequencies.

Furthermore, by adjusting the length of the notch 318, and further delaying the coupling of the end of the arm 306 relative to the conductive substrate 308, it may be possible to adjust the position of the discontinuity 310 along the perimeter of the conductive housing 302 of the device 100, which in turn could affect the length of the conductive element 304, and the length of the adjacent and/or horizontal portion of the arm 306. It is also possible that the position of the discontinuity 310 can be affected, independent of the length of the notch 318, if any.

While the conductive element 304 generally extends along the perimeter of the conductive housing 302 at top surface of the device 100, in at least some instances, an arm 306 can have two sections, a first section that extends along the side of the device 100 in a first direction, and a second section that extends along the side of the device 100 in a second direction. In the illustrated embodiment, the change in direction of the arm 306 coincides with a corner of the device 100, where the perimeter of the device similarly changes direction. While in the illustrated embodiment, the entirety of the conductive element 304 is generally present along the perimeter of the conductive housing at the top of the electrical device 100, it is possible that the conductive element 304 could additionally or alternatively extend along other surfaces of the device 100, and/or along other conductive elements having all or portions, which might be internal to the device.

Still further, while the arms 306, in the illustrated embodiment, are shown being coupled to the conductive substrate 308 at one end, it is possible that the arm 306 might not be directly coupled to the conductive substrate at either end. Just like the conductive element 304, the arm 306 could similarly be coupled to a signal source at some point along the length of the arm 306, and in turn the corresponding geometry of the arm may affect the frequencies at which the arm is better suited for radiating and/or receiving a signal.

In at least some instances, the formation of the conductive housing 302 includes metal(s) and/or a metal alloy, which coincides with the surrounding sidewall of the device 100. Openings can exist in the sidewall, which allows for the formation of a conductive element 304 and one or more arms 306, as well as the inclusion of features such as the placement of physical user actuatable buttons 104, as well as various other porting such as headphone jack, microphone ports, and memory card slots. In some instances, some of the openings, such as the openings which define the shape of the conductive element 304 and/or one or more arms 306, can be filled in with a nonconductive material such as a plastic type material.

The conductive substrate 308 in at least some instances can be part of a printed circuit substrate, such as in the form of a ground plane and/or a circuit shield. The printed circuit substrate can be used to receive electrical elements including electronic circuitry, components and/or modules, as well as conductive traces for interconnecting the electrical elements. The conductive substrate could additionally and/or alternatively form parts of one or more of the device surfaces, such as the back surface of the device. The conductive substrate could also additionally and/or alternatively form parts of some of the other device sub-assemblies including a display sub-assembly or a battery sub-assembly.

In the illustrated embodiment, the conductive housing 302, and correspondingly the device 100 is substantially rectangular in shape, notwithstanding the rounded corners. The overall shape of the conductive substrate 308 is similarly largely rectangular. However, while many of the overall shapes in the illustrated embodiment are substantially rectangular in shape, there is no requirement that their shapes be rectangular. Alternative shapes are possible without departing from the teachings of the present application.

Figure 4:
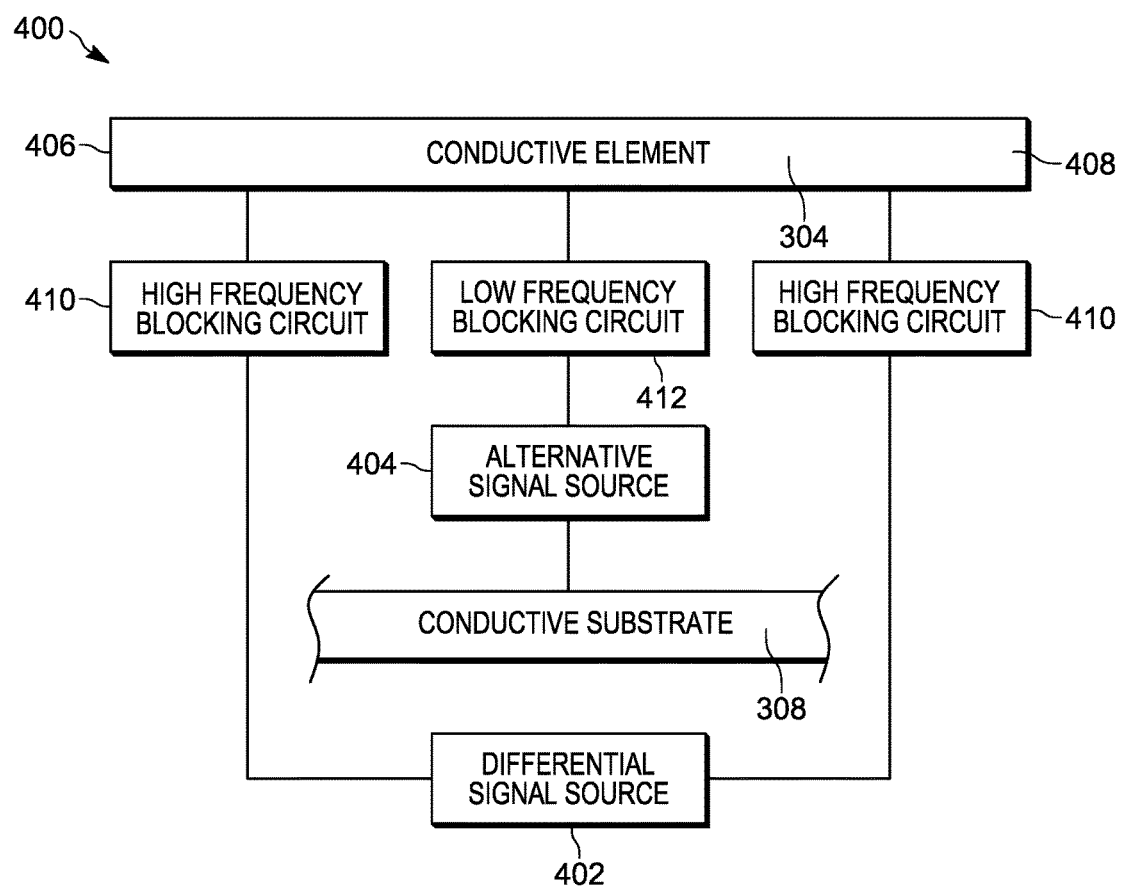
FIG. 4 is a block diagram of an antenna system having a conductive element for use with each of a differential signal source and an alternative signal source, in accordance with at least one embodiment.

FIG. 4 illustrates a block diagram 400 of an antenna system having a conductive element 304 for use with each of a differential signal source 402 and an alternative signal source 404, in accordance with at least one embodiment. In at least some instances, the conductive element 304 can be included as part of the perimeter of a conductive housing, where the conductive element 304 has a length that extends between two ends 406 and 408, a distance away from the conductive substrate 308.

The differential signal source 402 is coupled to the conductive element 304 between two points along the length of the conductive element 304, each of the two points being proximate a respective one of the two ends 406, 408 of the conductive element 304. More specifically, the differential signal source 402 couples to each of the two points via a respective high frequency blocking circuit 410. The high frequency blocking circuit 410 has the effect of filtering and/or attenuating to a larger extent signals having a higher corresponding frequency, as opposed to those signals having a lower corresponding frequency. One end of the differential signal source is coupled at or near a first end 406 of the conductive element 304, and the other end of the differential signal source is coupled at or near a second end 408 of the conductive element 304. The high frequency blocking circuit, depending upon how the values of the high frequency and low frequency are defined, enable a differential source 402 producing a relatively lower frequency signal to be applied across the conductive element 304. The alternative signal source 404 is coupled to the conductive element 304 at a point located between the two ends 406 and 408 of the conductive element 304 toward the center of the conductive element via a low frequency blocking circuit 412. The low frequency blocking circuit 412 has the effect of filtering and/or attenuating to a larger extent signals having a lower corresponding frequency, as opposed to those signals having a higher corresponding frequency. In turn, a higher frequency signal being produced by the alternative signal source 404 can be applied toward the center of the conductive element 304. By coupling a signal toward the center of the conductive element 304, via a low frequency blocking circuit 412, the conductive element 304 can function like a dual inverted "L"-shaped antenna for an applied higher frequency signal, where the currents can flow between the point at or near the center of the conductive element 304, to or from each of the respective ends 406 and 408 of the conductive element 304.

In at least one embodiment, the operational blocking thresholds for each of the high frequency blocking circuit 410 and the low frequency blocking circuit 412 are selected, so as to alternatively allow either the relatively lower frequency signals, such as near field communication signals, or the relatively higher frequency signals, such as cellular communication signals, to pass. More specifically, in at least one embodiment, the high frequency blocking circuit 410 is set so as to block a selected range of cellular communication signals, and the low frequency blocking circuit 412 is set so as to block a selected range of near field communication signals. This allows both sets of signals to be selectively applied to the conductive element 304 in a predetermined selected manner.

Figure 5:
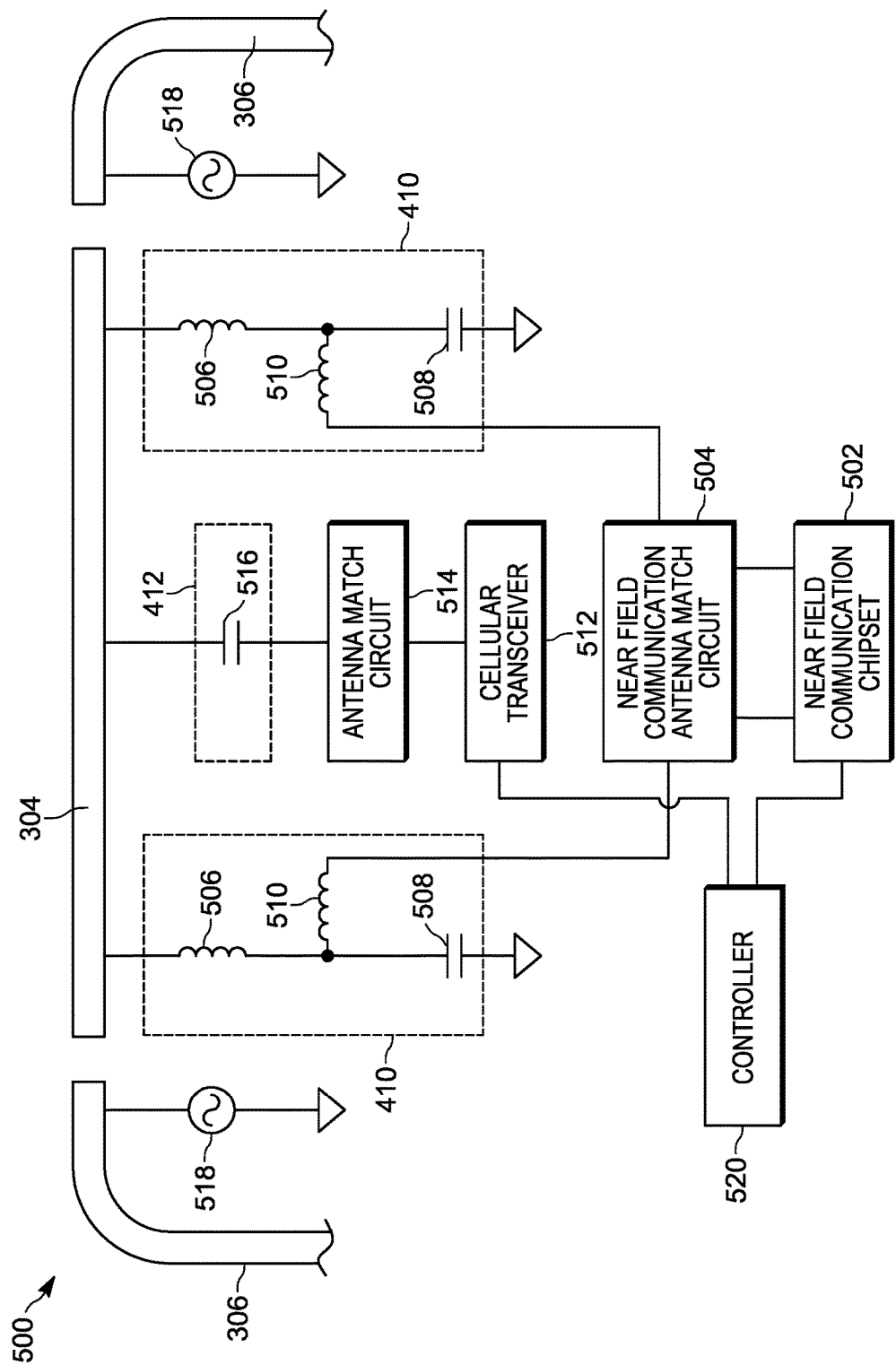
FIG. 5 is a partial schematic view of the conductive housing with a conductive element, a plurality of arms, and a plurality of signal sources.

FIG. 5 illustrates a partial schematic view 500 of the conductive housing with a conductive element, a plurality of arms, and a plurality of signal sources. The partial schematic view 500 similar to the block diagram illustrated in FIG. 4, illustrate multiple signal sources coupled to a conductive element 304. For example, corresponding structure similar to the differential signal source 402 illustrated in FIG. 4, can be included as part of a near field communication chipset 502, which can be coupled to the conductive element via a near field communication antenna match circuit 504, and respective high frequency blocking circuit 410. The near field communication antenna match circuit 504 can include impedance matching circuitry, which can assist in maximizing the amount of power being transferred from the chipset 502 to the radiating structure serving as an antenna, namely the conductive element 304. With judicious choices of matching topology, matching components and location of drive points along the conductive element 304, the performance of the cellular and the near field communication can be better optimized.

Each of the high frequency blocking circuits 410 in at least some embodiments can include a radio frequency blocking inductor 506, which is coupled to a respective end of the conductive element 304. The other end of the radio frequency blocking inductor 506 is coupled to ground via a radio frequency bypass capacitor 508. In at least some embodiments, a connection to ground can be facilitated through a connection to the conductive substrate 308. The other end of the radio frequency blocking inductor 506 is further coupled to the near field communication antenna match circuit 504, and indirectly one of the respective feeds of the differential signal source of the near field communication set, via a ballast inductor 510.

Structure similar to an alternative signal source 404, illustrated in FIG. 4, can be included as part of a cellular transceiver 512. The cellular transceiver 512 is coupled to the conductive element at a point toward the center of the conductive element via a low frequency blocking circuit 412 and an antenna match circuit 514. Similar to the near field communication antenna match circuit 504, the antenna match circuit 514 can assist the conveyance of a signal from the cellular transceiver 512 to the conductive element 304 by helping to limit the amount of reflected power. In the illustrated embodiment, the low frequency blocking circuit 412 includes a blocking capacitor 516, which is intended to block and/or attenuate signal currents associated with lower frequency signaling including the type used for near field communications.

In at least some instances, operation of the cellular transceiver 512 and the near field communication chipset 502 can be at least partially managed by a controller 520. Such a controller 520 could include one or more processors, which are capable of executing one or more sets of pre-stored instructions. The controller 520 can additionally or alternatively include state machines and/or logic circuitry. Such a controller 520 could be incorporated as part of the overall control of the device, or could be included as part of the structure specific to a wireless modem and/or the one or more transceivers.

In addition to the signal sources associated with the cellular transceiver 512, and the near field communication chipset 502, still further signal sources 518 can be coupled to the end of the arm 306, which is not more directly coupled to the conductive substrate 308, which in turn can be used to manage still further wireless communications including wireless communications of the same or different types. These additional signal sources 518 could also be at least partially managed by a controller, which is present in the device.

Figure 6:
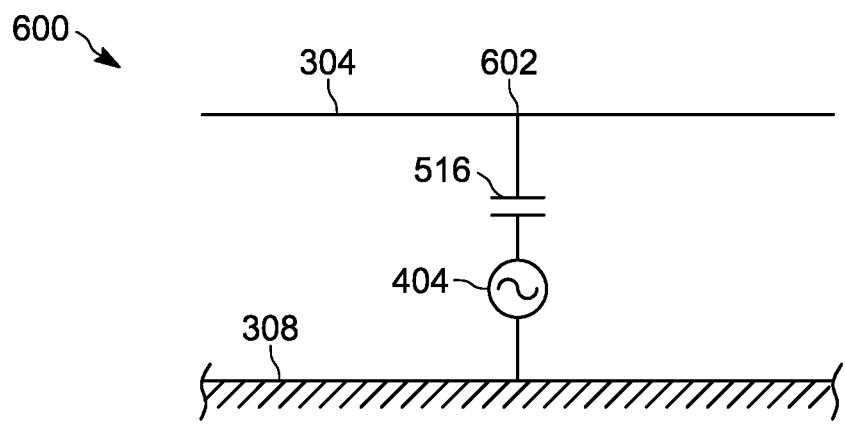
FIG. 6 is a simplified schematic view of a signal source coupled toward the center of a conductive element between the two ends.

FIG. 6 illustrates a simplified schematic view 600 of a signal source 404 coupled at a point 602 toward the center of the conductive element 304 between the two ends of the conductive element. In the illustrated embodiment, the alternative signal source 404, which could correspond to a cellular transceiver 512, is coupled to the conductive element 304 via a low frequency blocking circuit 412, which includes a blocking capacitor 516, which attenuates signals having lower frequencies from being conveyed to the conductive element 304 from the cellular transceiver 512. The signal source is further coupled to ground, which could be facilitated through a connection with the conductive substrate 308. All or portions of the conductive element 304 will have a geometry including the portions between the feed point and each of the ends, either separately or together, which will have a structure that is more or less suited for transmitting and/or receiving signals of various frequencies. More specifically, in the illustrated embodiment, the conductive element 304 has a pair of branches, where each branch corresponds to the point of connection by the alternative signal source 404 at or near the center of conductive element 304 and a respective one of each of the two ends of the conductive element 304. As a signal is applied to the conductive element via the feed point 602, energy will be conveyed through various portions of the structure, which will assist in the propagation and/or receipt of related signals of various frequencies, including signals in the range of at least some cellular frequencies.

Figure 7:
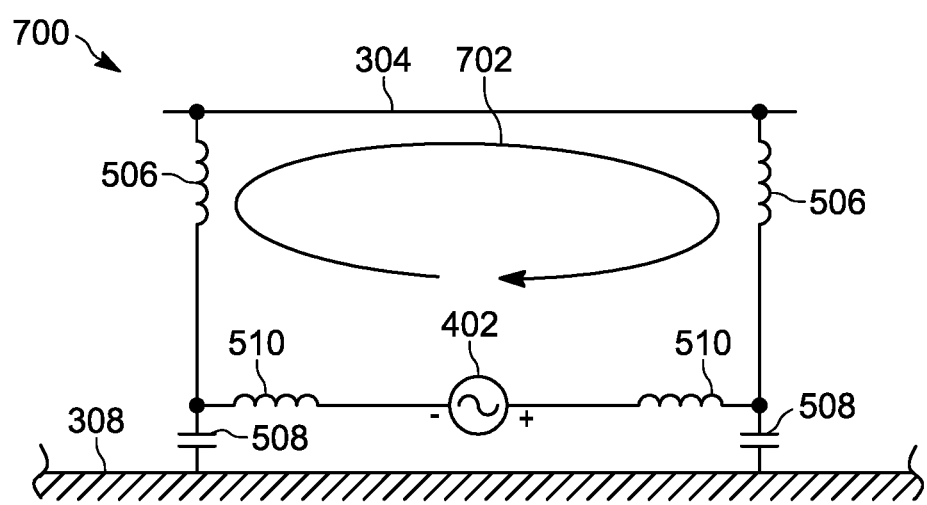
FIG. 7 is a simplified schematic view of a differential signal source coupled to a conductive element between a pair of points proximate respective ends of the conductive element.

FIG. 7 illustrates a simplified schematic view 700 of a differential signal source 402 coupled to a conductive element 304 between a pair of points proximate respective ends of the conductive element. Alternative terminals of the differential signal source 402 are each coupled to alternative respective ends of the conductive element via a corresponding high frequency blocking circuit, which in the illustrated embodiment each include a ballast inductor 510 in series with a radio frequency blocking inductor 506, as well as a radio frequency bypass capacitor 508, via which the connection point between the two inductors is coupled to ground. In at least the illustrated embodiment, the ground connection can be facilitated by a connection to the conductive substrate 308. Relative to the differential signal source 402 supplying a low frequency differential signal to the conductive element 304, a single current loop 702 is possible in the space between the conductive element 304 and conductive substrate 308.

Figure 8:
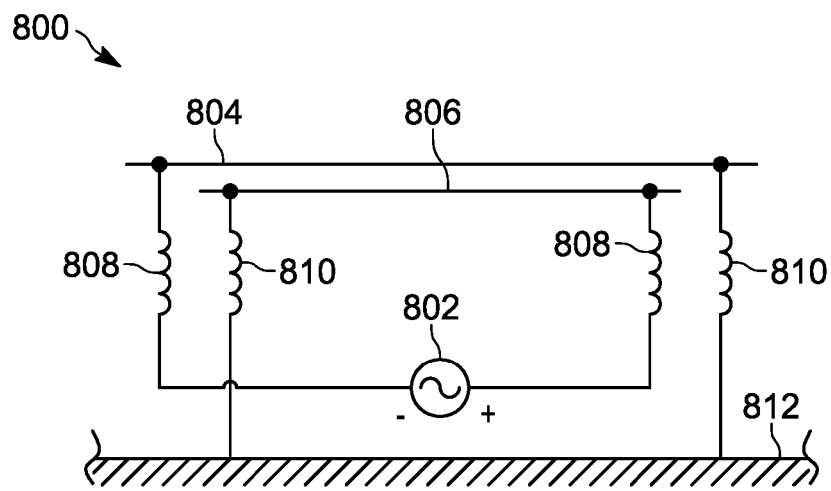
FIG. 8 is a simplified schematic view of a differential signal source coupled between a pair of separate conductive elements at respective opposite ends of the corresponding conductive element.

FIG. 8 illustrates a simplified schematic view 800 of an alternative embodiment, where a differential signal source 802 is coupled between a pair of separate conductive elements 804 and 806 at respective opposite ends of the corresponding conductive element. In this way, a current path can include multiple loops, where each of the conductive elements 804 and 806, separately corresponds to one of the respective loops. In the illustrated embodiment, the differential signal source 802 is coupled to the respective opposite ends of the corresponding conductive element 804 or 806 via a corresponding inductor 808. The other end of each of the conductive elements, which is not more directly coupled to one of the terminals of the differential signal source, is coupled to the conductive substrate 812 via a corresponding inductor 810. In other words, the left end of conductive element 804 is coupled more directly to one of the terminals of the differential signal source 802, and the right end of conductive element 806 is coupled more directly to the other one of the terminal of the differential signal source 802, while the right end of conductive element 804 is coupled more directly to the conductive substrate 812, and the left end of the conductive element 806 is coupled more directly to the conductive substrate 812.

In at least one embodiment, the pair of separate conductive elements 804 and 806, when viewed from an edge of a plane including both of the conductive elements 804 and 806, each have a length which at least partially overlaps the other. Within the plane including both of the conductive elements 804 and 806, there is a space between each of the conductive elements. In some instances, conductive element 804 may be substantially parallel to conductive element 806.

Figure 9:
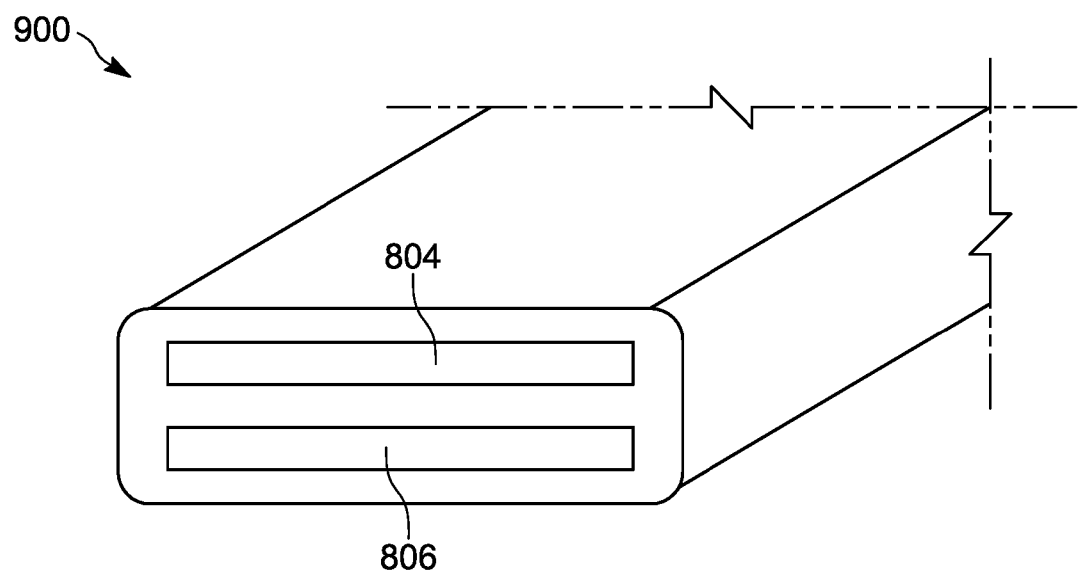
FIG. 9 is a top perspective view of an exemplary electronic device highlighting the inclusion of a pair of separate conductive element, which substantially overlap in accordance with one possible embodiment.

FIG. 9 illustrates a top perspective view 900 of an exemplary electronic device highlighting the inclusion of a pair of separate conductive element 804 and 806, which substantially overlap in accordance with one possible embodiment. In the illustrated embodiment, the plane within which both of the conductive elements 804 and 806 are included corresponds to the top of the device. Other configurations are possible without departing from the teachings of the present application including conductive elements that have a different size or shape, and/or are included in a plane that has a different position and/or orientation relative to the device.

While the preferred embodiments have been illustrated and described, it is to be understood that the invention is not so limited. Numerous modifications, changes, variations, substitutions and equivalents will occur to those skilled in the art without departing from the spirit and scope of the present invention as defined by the appended claims.

What is claimed is:

1. An antenna system for use in an electronic device, the antenna system comprising:
   a conductive substrate;
   a conductive element extending along a length between two ends a distance away from the conductive substrate, wherein an area between the conductive substrate and the conductive element form at least part of a loop which is internal to the antenna system;

a differential signal source coupled between two points along the length of the conductive element, each of the two points being proximate a respective one of the two ends of the conductive element, where the differential signal source is coupled to each of the two points via a high frequency blocking circuit; and an alternative signal source coupled to the conductive element between the two ends of the conductive element toward a center of the conductive element via a low frequency blocking circuit.

2. An antenna system in accordance with claim 1, wherein the high frequency blocking circuit includes a radio frequency blocking inductor.

3. An antenna system in accordance with claim 1, wherein the low frequency blocking circuit includes a blocking capacitor.

4. An antenna system in accordance with claim 1, wherein the conductive substrate includes at least part of a ground plane of a circuit substrate.

5. An antenna system in accordance with claim 1, wherein the conductive substrate is part of a conductive housing of the electronic device.

6. An antenna system in accordance with claim 1, wherein the conductive element is part of a conductive housing proximate a top edge surface of the electronic device.

7. An antenna system in accordance with claim 1, wherein the conductive substrate has a width, which corresponds to the distance between two opposite side edges of the conductive substrate proximate one end of the electronic device.

8. An antenna system in accordance with claim 7, wherein the two side edges of the conductive substrate are each respectively associated with a corresponding side edge of the electronic device.

9. An antenna system in accordance with claim 7, further comprising a pair of conductive arms, where each conductive arm in the pair of conductive arms has a connected end, which couples to the conductive substrate at alternative ones of the opposite side edges of the conductive substrate proximate the one end of the device, and an open end which extends away from the respective coupled side edge toward the other one of the opposite side edges in a direction of extension, where the open ends of the conductive arms in the pair extend toward one another, stopping short of touching or overlapping the other conductive arm in the pair in the direction of extension away from the respective coupled side edge, thereby forming a gap between the respective open ends of the pair of conductive arms.

10. An antenna system in accordance with claim 9, wherein the conductive element extends between the respective open ends of the pair of conductive arms in the gap formed there between.

11. An antenna system in accordance with claim 9, wherein the pair of conductive arms is part of a conductive housing of the electronic device.

12. An antenna system in accordance with claim 9, wherein a corresponding further signal source is coupled to each of the open ends of one or more of the pair of conductive arms.

13. An antenna system in accordance with claim 1, wherein the differential signal source supports a wireless communication connection including a wireless inductive coupling with another nearby antenna system.

14. An antenna system in accordance with claim 13, wherein the differential signal source is a wireless near field communication signal.

15. An antenna system in accordance with claim 1, wherein the alternative signal source supports a wireless communication connection including a cellular radio frequency signal.

16. An antenna system for use in an electronic device, the antenna system comprising:

a conductive substrate;

a pair of separate conductive elements, each conductive element extending along a length between two ends including a right side end and a left side end, a distance away from the conductive substrate, wherein an area between the conductive substrate and each of the separate conductive elements form at least part of a loop which is internal to the antenna system, and wherein along the respective lengths between the two ends, the separate conductive elements substantially overlap;

a differential signal source coupled between the pair of separate conductive elements at respective points along the length of the corresponding conductive element, each of the respective points being proximate a different one of the two ends of the separate conductive elements, wherein a first terminal of the differential signal source is coupled proximate the right side end of a first one of the pair of separate conductive elements, and a second terminal of the differential signal source is coupled proximate the left side end of a second one of the pair of separate conductive elements, and wherein the conductive substrate is coupled proximate to the one of the two ends of each of the pair of separate conductive elements that is not coupled to the differential signal source.

17. An antenna system in accordance with claim 16, wherein the pair of separate conductive elements each extend in a direction that is substantially parallel to one another.

18. An antenna system in accordance with claim 16, wherein the differential signal source is coupled to each of the respective points of the pair of separate conductive elements via a high frequency blocking circuit.

19. An antenna system in accordance with claim 16, wherein the conductive substrate is coupled proximate to the one of the two ends of each of the pair of separate conductive elements that is not coupled to the differential signal source via a high frequency blocking circuit.

20. An electronic device comprising:

a controller;

a plurality of transceivers coupled to the controller; and an antenna system including a conductive substrate, and a conductive element extending along a length between two ends a distance away from the conductive substrate, wherein an area between the conductive substrate and the conductive element form at least part of a loop which is internal to the antenna system;

wherein a differential signal source of a first one of the plurality of transceivers is coupled between two points along the length of the conductive element, each of the two points being proximate a respective one of the two ends of the conductive element, where the differential signal source is coupled to each of the two points via a high frequency blocking circuit; and wherein an alternative signal source associated with a second one of the plurality of transceivers is coupled to the conductive element between the two ends of the conductive element toward the center of the conductive element via a low frequency blocking circuit.

\* \* \* \* \*